United States Patent
Shinohara

(10) Patent No.: US 9,391,165 B2
(45) Date of Patent: Jul. 12, 2016

(54) SEMICONDUCTOR DEVICE AND METHOD OF MANUFACTURING THE SEMICONDUCTOR DEVICE

(71) Applicant: KABUSHIKI KAISHA TOSHIBA, Tokyo (JP)

(72) Inventor: Daisuke Shinohara, Kitakarni Iwate (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/475,508

(22) Filed: Sep. 2, 2014

(65) Prior Publication Data
US 2015/0214358 A1 Jul. 30, 2015

(30) Foreign Application Priority Data
Jan. 28, 2014 (JP) ................. 2014-013800

(51) Int. Cl.
| | |
|---|---|
| *H01L 21/02* | (2006.01) |
| *H01L 21/70* | (2006.01) |
| *H01L 29/78* | (2006.01) |
| *H01L 29/66* | (2006.01) |
| *H01L 29/06* | (2006.01) |
| *H01L 29/08* | (2006.01) |
| *H01L 21/265* | (2006.01) |

(52) U.S. Cl.
CPC ...... *H01L 29/66659* (2013.01); *H01L 29/0615* (2013.01); *H01L 29/0623* (2013.01); *H01L 29/0688* (2013.01); *H01L 29/0847* (2013.01); *H01L 29/7835* (2013.01); *H01L 21/26513* (2013.01); *H01L 29/0653* (2013.01)

(58) Field of Classification Search
CPC ... H01L 29/7816; H01L 21/265; H01L 29/36; H01L 29/66681; H01L 21/02; H01L 29/78
USPC .................. 257/286, 295, 336–339, E29.255, 257/E21.409, E29.256, E27.06; 438/286–288
See application file for complete search history.

(56) References Cited

U.S. PATENT DOCUMENTS

| | | | |
|---|---|---|---|
| 6,287,922 B1* | 9/2001 | Yu ..................... | H01L 21/28114 257/E21.205 |
| 8,143,691 B2 | 3/2012 | Ichijo | |
| 8,159,036 B2 | 4/2012 | Matsudai et al. | |
| 8,492,866 B1* | 7/2013 | Anderson ............... | H01L 21/76 257/106 |
| 2004/0033666 A1* | 2/2004 | Williams .......... | H01L 21/26513 438/297 |

(Continued)

FOREIGN PATENT DOCUMENTS

| | | |
|---|---|---|
| JP | 2002343960 A | 11/2002 |
| JP | 2009-004493 A | 1/2009 |
| JP | 4952042 B2 | 6/2012 |

*Primary Examiner* — Amar Movva
*Assistant Examiner* — Sheikh Maruf
(74) *Attorney, Agent, or Firm* — Patterson & Sheridan, LLP

(57) ABSTRACT

A semiconductor device includes a semiconductor region, a first well region which has a first conductive type, a second well region which has a second conductive type, a source region, a drain region, a channel region, and a gate insulation film. The first well region and the second well region are formed in the semiconductor region adjacent to each other. The source region is on the first well region; the drain region is on the second well region. The semiconductor region has a first region, a second region, and a third region. A dopant concentration of the second conductive type in the third region is higher than a dopant concentration of the second conductive type in the first region.

17 Claims, 7 Drawing Sheets

(56) References Cited

U.S. PATENT DOCUMENTS

| | | | |
|---|---|---|---|
| 2008/0029830 A1* | 2/2008 | Tsai | H01L 21/823807 257/408 |
| 2008/0113498 A1* | 5/2008 | Khemka | H01L 29/063 438/510 |
| 2010/0025756 A1* | 2/2010 | Fu | H01L 29/0634 257/328 |
| 2010/0065909 A1* | 3/2010 | Ichijo | H01L 29/1095 257/343 |
| 2012/0193709 A1* | 8/2012 | Sukegawa | H01L 21/823807 257/337 |
| 2013/0009272 A1* | 1/2013 | Sakurai | H01L 21/84 257/496 |
| 2013/0026545 A1* | 1/2013 | Dix | H01L 23/544 257/288 |

* cited by examiner

SEMICONDUCTOR DEVICE AND METHOD OF MANUFACTURING THE SEMICONDUCTOR DEVICE

CROSS-REFERENCE TO RELATED APPLICATION

This application is based upon and claims the benefit of priority from Japanese Patent Application No. 2014-013800, filed Jan. 28, 2014, the entire contents of which are incorporated herein by reference.

FIELD

Embodiments described herein relate generally to a semiconductor device and a method of manufacturing the semiconductor device.

BACKGROUND

For example, as a Metal Oxide Semiconductor (MOS) transistor having a high breakdown tolerance there has been known a semiconductor device such as a Double Diffused MOS (DMOS) transistor where a channel region of the MOS transistor is formed by a double diffusion process. In such a semiconductor device, there has been a demand for improvement in breakdown resistance and reliability, which contribute to improvement of the Safe Operating Area (SOA).

DETAILED DESCRIPTION

Figure 1:
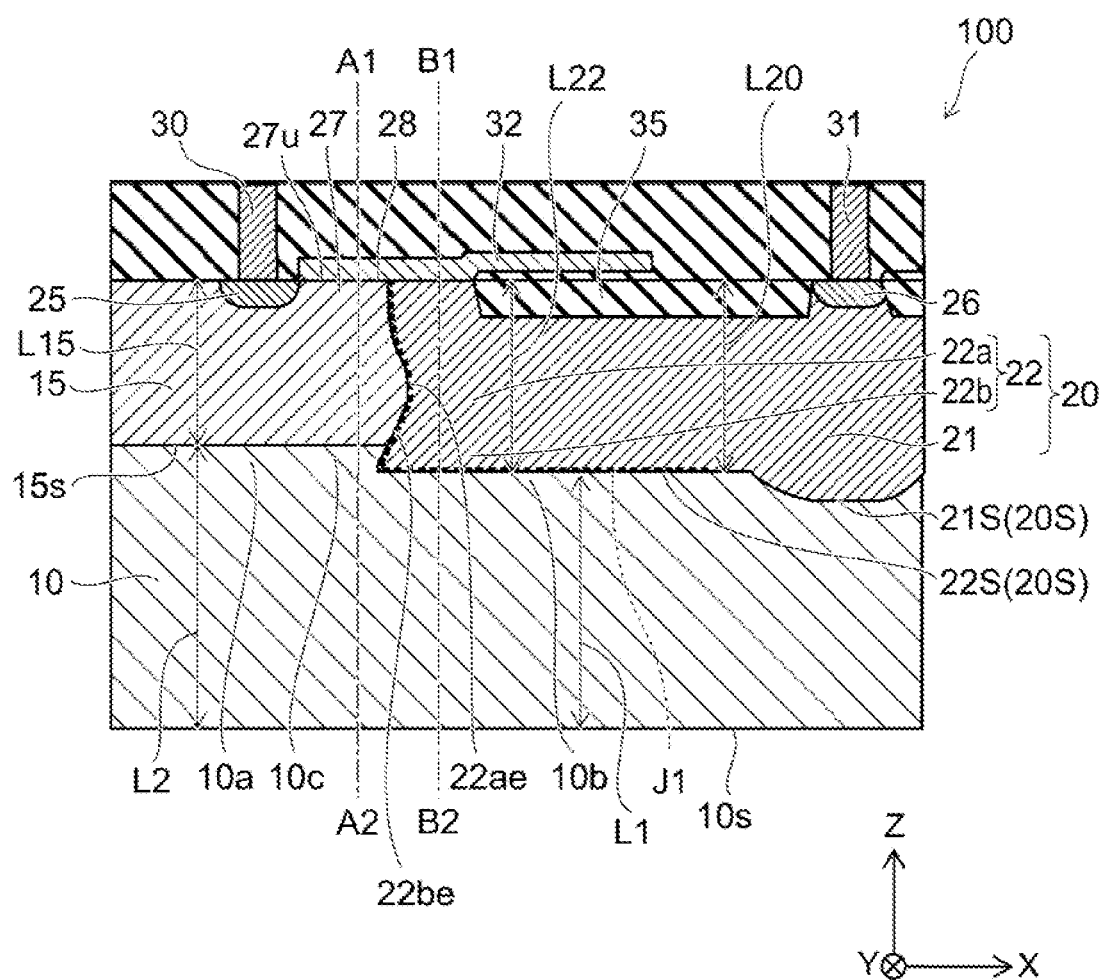
FIG. 1 is a schematic cross-sectional view illustrating a semiconductor device according to an example embodiment.

According to an embodiment, there is provided a semiconductor device where the resistance of an SOA is increased and a method of manufacturing the semiconductor device.

A semiconductor device (e.g., a transistor device) includes a first well region of a first conductive type in a semiconductor region and extending from an upper surface plane of the semiconductor region in a first direction orthogonal to the upper surface plane for a first distance. A second well region of a second conductive type is disposed in the semiconductor region adjacent to the first well region in a second direction that is perpendicular to the first direction. The second well region extends from the upper surface plane of the semiconductor region in the first direction for a second distance. A source region of the second conductive type is disposed on the first well region. A drain region of the second conductive type is disposed on the second well region. A gate electrode is disposed on a portion of the semiconductor region between the source and drain regions. The semiconductor region has a first region at a first position below the first well region in the first direction, a second region at a second position below the second well region in the first direction, and a third region at a third position below the first well region in the first direction and between the first position and the second position in the second direction. A concentration of a dopant of the second conductive type in the third region is higher than a concentration of a dopant of the second conductive type in the first region.

In general, according to one embodiment, there is provided a semiconductor device including: a semiconductor region; a first well region; a second well region; a source region; a drain region; an intermediate region; a gate electrode; a gate insulation film; a source electrode; and a drain electrode. The first well region is formed on the semiconductor region, and is of a first conductive type. The second well region is formed on the semiconductor region, disposed parallel to the first well region in a direction which intersects with a depth direction extending toward the semiconductor region from the first well region, and is of a second conductive type. The source region is formed on the first well region, and is of the second conductive type. The drain region is formed on the second well region, and is of the second conductive type. The intermediate region is disposed between the source region and the drain region. The gate electrode is formed on the intermediate region. The gate insulation film is formed between the intermediate region and the gate electrode. The source electrode is electrically connected with the source region. The drain electrode is electrically connected with the drain region. The semiconductor region has a region at a first position disposed below the first well region, a region at a second position disposed below the second well region, and a region at a third position disposed below the first well region between the first position and the second position. A concentration of a dopant of the second conductive type in the region at the third position is higher than a concentration of a dopant of the second conductive type in the region at the first position.

Hereinafter, respective embodiments are explained with reference to drawings.

The drawings are schematic or conceptual views and hence, the relationship between thicknesses and widths of respective parts, a ratio of sizes of the respective parts and the like are not always equal to those of an actual semiconductor device. Further, even when the identical parts are described in the drawings, sizes or ratios of sizes of the parts may differ depending on drawings.

In this disclosure and the respective drawings, portions that are identical with portions described previously with respect to the already explained drawings are given by the same symbols, and the detailed explanation of the identical portions is omitted when appropriate.

In the embodiment explained hereinafter, the explanation is made assuming that a first conductive type is a p-type, and a second conductive type is an n-type. The embodiment may be also carried out also in the case where the first conductive type is an n-type, and the second conductive type is a p-type.

First Embodiment

The first embodiment relates to a semiconductor device. The semiconductor device according to the embodiment may be a DMOS, a Lateral DMOS (LDMOS), a Drain Extended MOS (DEMOS), an Extended Drain MOS (EDMOS) or the like, for example.

FIG. 1 is a schematic cross-sectional view which exemplifies the semiconductor device according to the first embodiment.

As illustrated in FIG. 1, a semiconductor device 100 according to the embodiment includes: a semiconductor region 10; a first well region 15; a second well region 20; a source region 25; a drain region 26; a channel region 27; a gate insulation film 28; a source electrode 30; a drain electrode 31; and a gate electrode 32. In this embodiment, the semiconductor device 100 further includes an insulating separation film 35. In this embodiment, the semiconductor device 100 is an n-channel DMOS.

A silicon (Si) substrate is used for forming the semiconductor region 10, for example. In this embodiment, p-type silicon (Si) is used for forming the semiconductor region 10, for example. N-type (n-type) silicon may be used to form the semiconductor region 10.

An epitaxial layer is formed on the substrate, for example. The semiconductor region 10 may be formed of an epitaxial layer formed on the substrate. In this embodiment, the semiconductor region 10 is formed of a p-type epitaxial layer. In another embodiment, an n-type epitaxial layer may be used to form the semiconductor region 10.

In some embodiments, the epitaxial layer need not be formed. In such a case, a substrate (or a portion thereof) is used as the semiconductor region 10. The first well region 15, the second well region 20, the source region 25, the drain region 26, the channel region 27 and the like are directly formed in or on the substrate.

The semiconductor region 10, the first well region 15, the second well region 20, the source region 25, the drain region 26 and the channel region 27 which are explained hereinafter are made of Si, for example. However, a material for forming these regions is not limited to silicon, and these regions may be formed using silicon carbide, gallium nitride or the like, for example.

The first well region 15 is formed on the semiconductor region 10. The first well region 15 is of a p-type. A concentration of a p-type dopant in the first well region 15 is higher than a concentration of a p-type dopant in the semiconductor region 10. Boron (B) is used as a p-type dopant, for example.

The second well region 20 is formed on the semiconductor region 10. The second well region 20 is of an n-type. Phosphorus (P) or arsenic (As) is used as an n-type dopant, for example.

The source region 25 is formed on the first well region 15. The source region 25 is of an n-type. The source electrode 30 is formed on the source region 25 and is electrically connected with the source region 25.

The drain region 26 is formed on the second well region 20. The drain region 26 is of an n-type. The drain electrode 31 is formed on the drain region 26 and is electrically connected with the drain region 26.

A concentration of an n-type dopant in the source region 25 is higher than a concentration of an n-type dopant in the second well region 20, for example. A concentration of an n-type dopant in the drain region 26 is higher than the concentration of an n-type dopant in the second well region 20, for example.

The channel region 27 (intermediate region) is disposed between the source region 25 and the drain region 26. The gate electrode 32 is formed on the channel region 27. The gate insulation film 28 is formed between the gate electrode 32 and the channel region 27.

Polysilicon is used for forming the gate electrode 32, for example. Silicon oxide or silicon oxynitride is used for forming the gate insulation film 28.

In this embodiment, a pn junction boundary J1 is formed at a position corresponding to a boundary between the second well region 20 and the semiconductor region 10 as well as at a position corresponding to a boundary between the first well region 15 and the second well region 20.

The direction from the semiconductor region 10 to the gate electrode 32 is taken to be the Z axis direction (depth direction). One direction perpendicular to the Z axis direction is taken to be the X axis direction (first direction). The direction which is perpendicular to the X axis direction and is perpendicular to the Z axis direction is taken to be the Y axis direction. For example, the X axis direction is the direction which is directed from the first well region 15 to the second well region 20.

In this embodiment, the insulating separation film 35 is formed on the second well region 20. The insulating separation film 35 is disposed between the drain region 26 and the channel region 27. For example, the insulating separation film 35 is in contact with the drain region 26.

The insulating separation film 35 has a Shallow Trench Isolation (STI) structure, for example. A depth of the insulating separation film 35 is larger than a depth of the drain region 26. Silicon oxide is used for forming the insulating separation film 35, for example.

The second well region 20 may include a first portion 21 and a second portion 22. The second portion 22 is disposed between the first portion 21 and the first well region 15. For example, the first portion 21 is disposed below the drain region 26. For example, the second portion 22 is disposed below the insulating separation film 35. For example, a concentration of an n-type dopant in the second portion 22 is lower than a concentration of an n-type dopant in the first portion 21.

The second portion 22 is a Resurf (Drift) region in the DMOS, for example. For example, a lower surface of the insulating separation film 35 is in contact with the second portion 22. An edge portion of the insulating separation film 35 on a channel region 27 side is in contact with the second portion 22.

The channel region 27 has an upper surface 27u (first surface). The upper surface 27u is a surface of the channel region 27 on a gate insulation film 28 side. For example, the upper surface 27u is in contact with the gate insulation film 28. The second well region 20 has a lower surface 20s disposed on a semiconductor region 10 side. The first portion 21 has a lower surface 21s disposed on the semiconductor region 10 side. The second portion 22 has a lower surface 22s disposed on the semiconductor region 10 side. The first well region 15 has a lower surface 15s (bottom portion) disposed on the semiconductor region 10 side. The semiconductor region 10 has an end 10s on a side opposite the first well region 15 and the second well region 20.

For example, a depth L20 of the second well region 20 (a first distance, a distance between a position of the upper surface 27u along the Z axis direction and a position of the lower surface 20s along the Z axis direction) is larger than a depth L15 of the first well region 15 (a second distance, a distance between the position of the upper surface 27u along the Z axis direction and a position of the lower surface 15s along the Z axis direction).

For example, a depth L22 of the second portion 22 (a difference between the position of the upper surface 27u along the Z axis direction and the position of the lower surface 22s along the Z axis direction) is larger than the depth L15 of the first well region 15.

A distance along the Z axis direction between an end of the second well region 20 on a second region 10b side (for example, the lower surface 20s, that is, a lower surface of the second well region 20 above the second position) and the upper surface 27u is a first distance (the depth L20 or the depth L22). A length along the Z axis direction between an end of the first well region 15 on a first region 10a side (for example, the lower surface 15s, that is, a lower surface of the first well region 15 above the first position) and the upper surface 27u is a second distance (depth L15). The first distance is longer than the second distance.

For example, a difference between the depth L22 of the second well region 20 (a depth of the second portion 22) and the depth L15 of the first well region 15 is from 0.1 micrometers (μm) to 0.5 micrometers, both ends of the range inclusive. A difference between the first distance and the second distance is from 0.1 μm to 0.5 μm both inclusive.

That is, the semiconductor region 10 includes: a first region 10a (first position); a second region 10b (second position); and a third region 10c (third position). The second region 10b is disposed parallel to the first region 10a in the first direction (for example, the X axis direction). The third region 10c is disposed between the first region 10a and the second region 10b. The first well region 15 is formed on the first region 10a and the third region 10c. The first well region 15 is disposed parallel to the first region 10a and the third region 10c in the second direction (the depth direction, the Z axis direction in this embodiment). The second direction intersects with the first direction. The second well region 20 is formed on the second region 10b, and is disposed parallel to the second region 10b in the second direction.

That is, the first region 10a and the third region 10c are positioned below the first well region 15. The second region 10b is positioned below the second well region 20.

At least a portion of the third region 10c is disposed below an edge portion of the first well region 15 on a second well region 20 side, for example. For example, the first region 10a is brought into contact with the first well region 15. For example, the third region 10c is in contact with the first well region 15. For example, the first region 10a is formed below the source region 25. At least a portion of the third region 10c is disposed below the gate electrode 32.

For example, the region at the third position is disposed below an edge portion of the first well region 15 on the second well region 20 side. For example, the first position is disposed below the source region 25, and the third position is disposed below the gate electrode 32.

For example, the second portion 22 of the second well region 20 includes an upper side portion 22a and a lower side portion 22b. The lower side portion 22b is disposed between the upper side portion 22a and the semiconductor region 10. The upper side portion 22a includes an edge portion 22ae on a first well region 15 side. The lower side portion 22b includes an edge portion 22be on the first well region 15 side.

For example, a position of the edge portion 22be along the X axis direction is closer to a position of the source region 25 along the X axis direction than a position of the edge portion 22ae along the X axis direction is. That is, the boundary J1 has a shape where the boundary J1 extends below the first well region 15. The second portion 22 has a shape where the second portion 22 extends below the first well region 15. Accordingly, a concentration of an n-type dopant in the third region 10c is higher than a concentration of an n-type dopant in the first region 10a.

Figure 2:
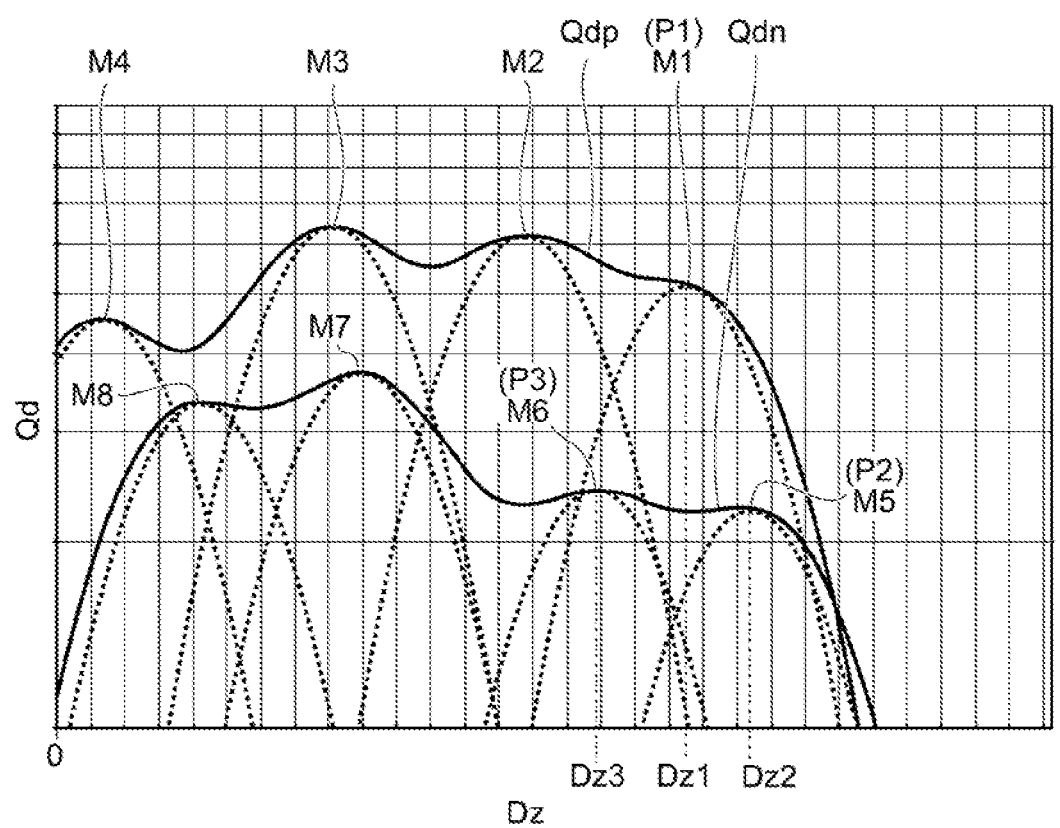
FIG. 2 is a graph which exemplifies a distribution of dopant in the semiconductor device.

FIG. 2 is a graph which exemplifies a distribution of dopant in the semiconductor device according to the embodiment.

A dopant concentration Qd in the semiconductor device 100 is taken on an axis of ordinates in FIG. 2. A depth Dz along the Z axis direction is taken on an axis of abscissas in FIG. 2. A position where a depth Dz is 0 (depth Dz=0) is a position of the upper surface 27u along the Z axis direction. The direction along which the depth Dz is increased corresponds to the direction directed from the gate electrode 32 to the semiconductor region 10.

FIG. 2 illustrates a distribution Qdp of concentration of a p-type dopant in the first well region 15 and a distribution Qdn of concentration of an n-type dopant in the second well region 20. The distribution Qdp of concentration of a p-type dopant is a distribution taken along a cut-line A1-A2 in FIG. 1. The distribution Qdn of concentration of an n-type dopant is a distribution taken along a cut-line B1-B2 in FIG. 1.

As illustrated in FIG. 2, each of the distribution Qdp and the distribution Qdn has at least one maximum value. For example, the first well region 15 and the second well region 20 are formed through a plurality of ion injections. A plurality of maximum values correspond to a plurality of ion injections, respectively. For example, the distribution Qdp and the distribution Qdn have a plurality of peaks (maximum values) respectively.

In this embodiment, the distribution Qdp is derived from the first to fourth maximum values M1 to M4. The depth Dz at the fourth maximum value M4 is smaller than the depths Dz at the first to third maximum values M1 to M3.

The depth Dz (first depth Dz1) at the first maximum value M1 (first peak P1) is larger than depths Dz at the plurality of peaks (second to fourth maximum values M2 to M4). The dopant concentration Qd at the first maximum value M1 is from $1\times10^{16}$/cubic centimeters ($cm^3$) to $1\times10^{19}/cm^3$ both inclusive, for example.

In this embodiment, the distribution Qdn is derived from fifth to eighth maximum values M5 to M8. The depth Dz (second depth Dz2) at the fifth maximum value M5 (second peak P2) is larger than the depths Dz at sixth to eighth maximum values M6 to M8. The dopant concentration Qd at the fifth maximum value M5 is from $1\times10^{14}/cm^3$ to $1\times10^{17}/cm^3$ both inclusive, for example.

The maximum value (the fifth maximum value M5 in this embodiment) at the deepest position out of the maximum values of the distribution Qdn is disposed at a deeper position than the maximum value (the first maximum value M1 in this embodiment) at the deepest position out of the maximum values of the distribution Qdp. The distribution Qdn has the second peak P2 (fifth maximum value M5) having a second depth Dz2 larger than the first depth Dz1 of the first peak P1 (first maximum value M1). That is, a depth of the second well region 20 is greater than a depth of the first well region 15. For example, a difference between the first depth Dz1 and the second depth Dz2 is from 0.1 μm to 0.5 μm both inclusive.

The distribution Qdn has a third peak P3 (sixth maximum value M6) having a third depth Dz3, for example. The first depth Dz1 is larger than the third depth Dz3.

That is, the distribution Qdp has a plurality of peaks including the first peak P1 at a first peak position (first depth Dz1) in the Z axis direction. A distance along the Z axis direction between the first peak position and the upper surface 27u is longer than a distance along the Z axis direction between respective positions of the plurality of peaks (second to fourth maximum values M2 to M4) in the Z axis direction and the upper surface 27u. The distribution Qdn has the second peak P2 at a second peak position (second depth Dz2) in the Z axis direction. A distance between the second peak position and the upper surface 27u along the Z axis direction is longer than a distance between the first peak position and the upper surface 27u along the Z axis direction.

A difference between the distance between the second peak position and the upper surface 27u along the Z axis direction and the distance between the first peak position and the upper surface 27u along the Z axis direction is 0.1 µm to 0.5 µm inclusive.

The distribution Qdn has the third peak P3 at a third peak position (third depth Dz3) in the Z axis direction. A distance between the third peak position and the upper surface 27u along the Z axis direction is shorter than a distance between the first peak position and the upper surface 27u along the Z axis direction.

For example, an npn bipolar transistor is parasitic in the semiconductor device 100. For example, the drain region 26 functions as a collector, the source region 25 functions as an emitter, and the channel region 27 functions as a base.

For example, in a semiconductor device such as a DMOS, a characteristic is enhanced by optimizing a BVdss (breakdown voltage) and a RonA (on-resistance per unit area). On the other hand, there has been a demand for improvement to an SOA and the increase of the resistance to Electrical Static Destruction (ESD).

For example, when a potential of the channel region 27 which functions as the base is increased, the parasitic bipolar transistor is turned on so that an electric current is increased. Due to such an increase of an electric current, a failure due to an ESD is caused. In view of the above, in this embodiment the operation of the npn bipolar transistor (parasitic transistor) which is parasitic in the semiconductor device 100 is suppressed. The resistance to an ESD event may be enhanced by suppressing the operation of the transistor.

For example, a base current is decreased or a base resistance is decreased. By decreasing the base current or the base resistance, the increase of a potential of the channel region 27 which functions as the base is suppressed. Accordingly, the operation of the parasitic transistor is suppressed so that the resistance to ESD may be increased.

For example, to focus on a base current, there may be a case where the base current is not an electric current generated by an electric current which flows between a drain and a source. For example, the base current may be an electric current which is generated by impact ions formed due to the concentration of an electric field.

When a surge voltage is applied to the second well region 20 through the drain electrode 31, an intense electric field is generated at an interface between the second well region 20 and the channel region 27. Impact ions are generated due to such an intense electric field. The generated impact ions are injected into the channel region 27 while further increasing impact ions. Accordingly, a potential of a base is increased so that a parasitic transistor is operated whereby a failure due to an ESD occurs.

In a semiconductor device such as a DMOS, impact ions are generated in a region where an electric field is concentrated. For example, the region where the electric field is concentrated is a junction interface between a drift layer (the second portion 22 of the second well region 20, for example) and a diffusion layer of the channel region 27. The generated impact ions advance in the direction perpendicular to equipotential lines. Impact ions impinge on other ions during advancing so that avalanche amplification occurs whereby an amount of the impact ions is increased.

In this embodiment, the generation of impact ions and the increase of an amount of impact ions are suppressed. By suppressing the generation of impact ions and the increase of an amount of impact ions, an amount of a base current is decreased so that the increase of a potential at a base may be suppressed. Accordingly, the operation of the parasitic transistor may be suppressed so that the resistance of ESD may be increased.

In the semiconductor device 100, for example, a depth of the second well region 20 is larger than a depth of the first well region 15. Accordingly, an electric field concentration spot is disposed at a place deep from a surface.

In the semiconductor device 100, a concentration of an n-type dopant in the third region 10c is higher than a concentration of an n-type dopant in the first region 10a. Due to such dopant concentrations, equipotential lines extend along the longitudinal direction (Z axis direction), for example, in a deep spot where an electric field is concentrated. Accordingly, few, if any, generated impact ions flow toward the channel region 27 which is a current path between a drain and a source. That is, it is possible to suppress the avalanche amplification caused by an electric current which flows between the source and the drain.

In the case of a distribution of concentration of a dopant when the second well region 20 is shallower than the first well region 15, for example, an electric field concentration spot is disposed in the channel region 27 in the vicinity of the insulating separation film 35. In this case, impact ions are liable to be generated in the channel region 27. That is, avalanche amplification is liable to occur. To the contrary, in the semiconductor device 100 according to the embodiment, by setting a distribution of concentration of a dopant as illustrated FIG. 2, an electric field concentration spot is positioned in the vicinity of a bottom portion of the second well region 20, for example. Due to such a configuration, few if any generated impact ions flow into the channel region 27 disposed on a front surface.

In the embodiment, generated impact ions are liable to flow toward a sub gate or a back gate. Accordingly, the generated impact ions may be effectively released.

According to the embodiment, an operation of the parasitic transistor may be suppressed by adjusting a profile of dopants. Accordingly, the generation of impact ions and the increase of an amount of impact ions are suppressed so that the SOA and the resistance to ESD may be improved.

Figure 3:
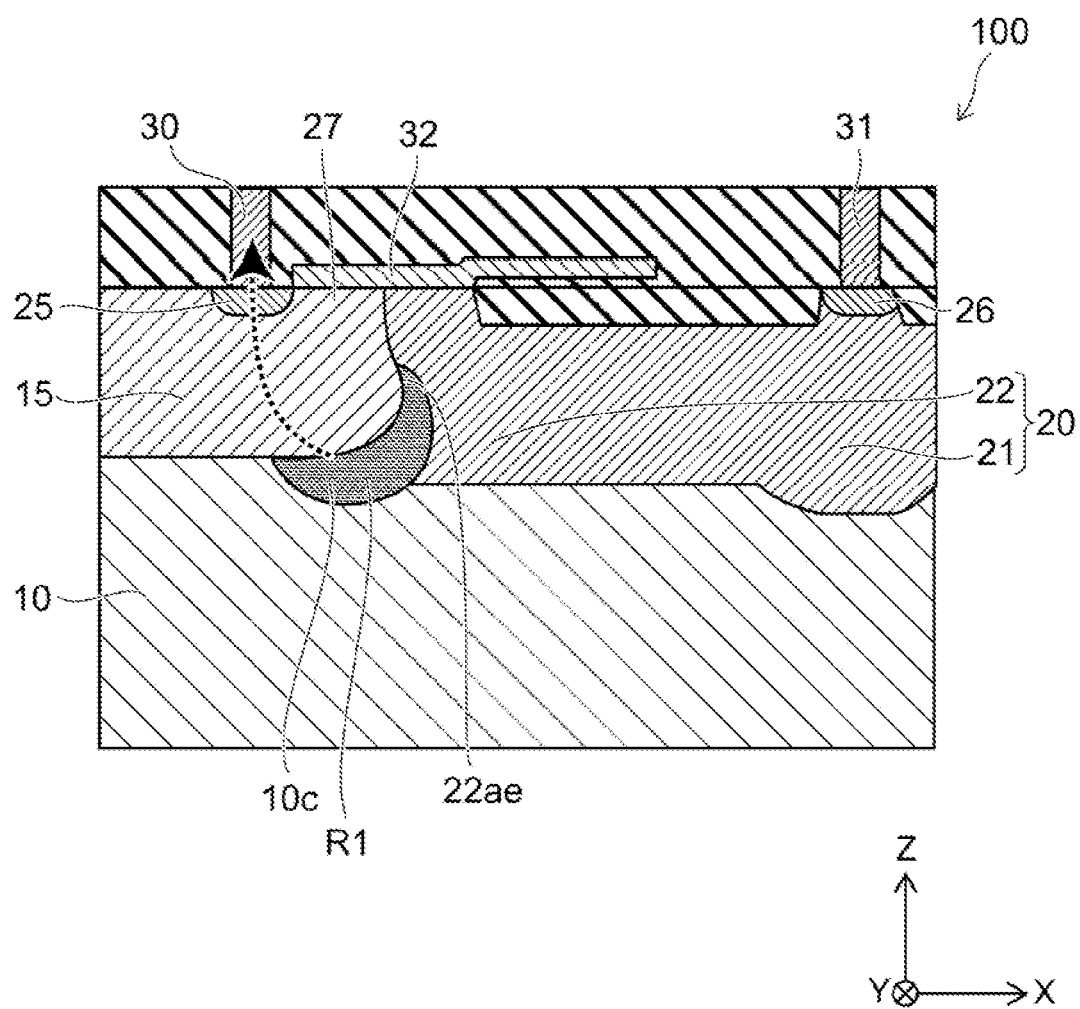
FIG. 3 is a schematic cross-sectional view illustrating a characteristic of the semiconductor device.

FIG. 3 is a schematic cross-sectional view which exemplifies a characteristic of the semiconductor device according to the embodiment.

FIG. 3 schematically illustrates an electric field concentration spot and the flow of impact ions in the semiconductor device 100. A state illustrated in FIG. 3 is obtained by a simulation in which a pulse having a high voltage (surge voltage) is applied to the drain electrode 31, for example. Conditions of a voltage applied to an electrode of the semiconductor device 100 are conditions corresponding to a test of the resistance to an ESD event, for example.

In the semiconductor device 100, a maximum value of an electric field is generated in a region R1 (electric field concentration spot) in the vicinity of the edge portion 22be of the second well region 20. As illustrated in FIG. 3, the region R1 is positioned below the channel region 27.

In the semiconductor device 100, a concentration of an n-type dopant in the third region 10c is higher than a concentration of an n-type dopant in the first region 10a. Due to such dopant concentrations, the second portion 22 has a shape where the second portion 22 extends below the first well region 15. Due to such a shape, electric field concentration spot may be guided to a bottom portion of the interface from a front surface side (an area in a vicinity of the channel region 27).

When a DMOS is in a normal operation state, an electric current flows in the channel region 27, for example. In this embodiment, a spot where an electric field is concentrated is disposed at a deeper spot than a path through which an electric current flows when the DMOS is in a normal operation state.

Due to such a configuration, the generation of impact ions and the increase of an amount of impact ions may be suppressed.

For example, an impact ionization rate is high at a spot having a large electric field. In the semiconductor device 100, an impact ionization rate is high in the region R1. The region where impact ions are liable to be generated is a region disposed at a deeper spot than the path through which an electric current flows when the DMOS is in a normal operation state. In the semiconductor device 100, impact ions are generated in a spot which is not a main current path. Accordingly, the increase of an amount of impact ions may be suppressed.

For example, impact ions are generated due to a surge voltage. Along with the generation of the impact ions, an impact ion current is generated. A magnitude of an impact ion current is large at a spot where an electric field is concentrated (region R1). In the semiconductor device 100, a magnitude of an impact ion current in the path through which an electric current flows when the DMOS is in a normal operation state is relatively small. The impact ion current generated in the region R1 passes the first well region 15, and flows toward the source region 25, for example (a path indicated by an arrow in FIG. 3).

In the semiconductor device 100 according to the embodiment, a concentration of an n-type dopant in the third region 10c is higher than a concentration of an n-type dopant in the first region 10a. The second well region 20 has a shape where the second well region 20 extends below the first well region 15. Due to such dopant concentrations, equipotential lines form vertical stripes in a deep region where an electric field is concentrated. Few, if any impact ions generated in the deep region below the channel region 27 flow into a channel region disposed on a front surface.

In this manner, in the semiconductor device 100, it is possible to dispose a spot where an electric field strength becomes maximum at a spot other than a current path between a source and a drain. Accordingly, the generated impact ions do not pass a region of the current path where an electric current flows through a channel. Accordingly, the generation of impact ions due to an electric current may be suppressed. Further, the operation of the parasitic transistor may be suppressed so that reliability of the semiconductor device and the resistance to ESD may be increased.

Figure 4A:
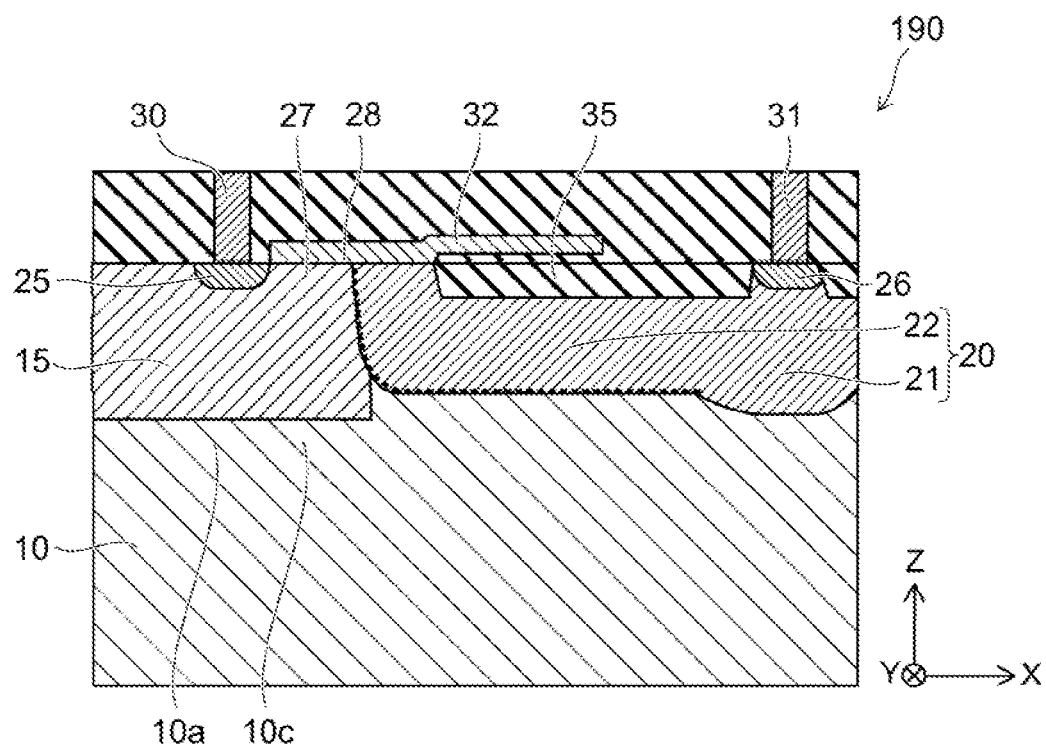
FIG. 4A and FIG. 4B are schematic cross-sectional views which exemplify the semiconductor device of a reference example.
Figure 4B:
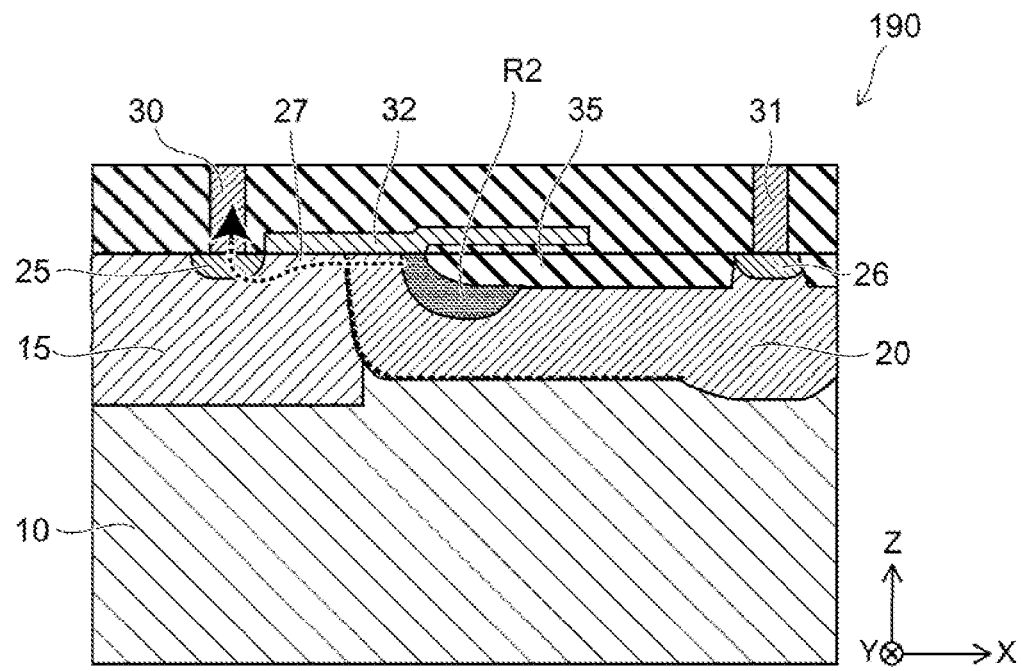

FIG. 4A and FIG. 4B are schematic cross-sectional views which exemplify a semiconductor device of the reference example.

A semiconductor device 190 illustrated in FIG. 4A and FIG. 4B also includes: the semiconductor region 10; the first well region 15; the second well region 20; the source region 25; the drain region 26; the channel region 27; the gate insulation film 28; the source electrode 30; the drain electrode 31; the gate electrode 32; and the insulating separation film 35.

In the semiconductor device 190, a concentration of an n-type dopant in the first region 10a is substantially equal to a concentration of an n-type dopant in the third region 10c.

As illustrated in FIG. 4A, for example, a depth of the first well region 15 is larger than a depth of the second well region 20. A shape of the second well region 20 differs from the shape of the second well region 20 where the second well region 20 extends below the first well region 15.

FIG. 4B is a schematic cross-sectional view which exemplifies a characteristic of the semiconductor device of the reference example. FIG. 4B schematically illustrates an electric field concentration spot and an electric current generated by impact ions in the semiconductor device 190. In the same manner as FIG. 3, a state illustrated in FIG. 4B may be obtained by a simulation where a pulse having a high voltage (surge voltage) is applied to the drain electrode 31 of the semiconductor device 190.

In the semiconductor device 190, a maximum value of an electric field is generated in a region R2 at an edge portion of an insulating separation film 35 on a source region 25 side. In the region R2, an intensity of an electric field is large. As illustrated in FIG. 4B, the region R2 having an electric field having a large intensity is disposed in the vicinity of the channel region 27.

For example, impact ions are generated in the region R2. Along with the generation of the impact ions, an impact ion current is generated. The impact ion current passes a path (channel region 27) through which an electric current flows when a DMOS is in a normal operation state, and flows toward the source region 25 (a path indicated by an arrow in FIG. 4B). In such a semiconductor device of the reference example, it is difficult to suppress the increase of an amount of impact ions.

There has been known a semiconductor device of another reference example where a spot having a large electric field intensity is disposed at a deep position below the channel region 27, for example.

The semiconductor device of this reference example also includes: the semiconductor region 10; the first well region 15; the second well region 20; the source region 25; the drain region 26; the channel region 27; the gate insulation film 28; the source electrode 30; the drain electrode 31; the gate electrode 32 and the insulating separation film 35. A concentration of an n-type dopant in the first region 10a and a concentration of an n-type dopant in the third region 10c are substantially equal to each other.

In the semiconductor device of the reference example, a shape of the second well region 20 differs from the shape of the second well region 20 where the second well region 20 extends below the first well region 15.

In the semiconductor device of the reference example having such a configuration, an impact ion current is generated in a region at a deep position below the channel region 27. There may be a case where the generated impact ion current flows toward the channel region 27, for example. A path through which an impact ion current flows and a current path between a source and a drain (a path through which an electric current flows when a DMOS is in a normal operation state) are not separated from each other. Accordingly, there may be a case where reliability of the semiconductor device or the resistance to ESD is deteriorated.

To the contrary, in the semiconductor device 100 according to the embodiment, equipotential lines extend along the Z axis direction in the region R1 disposed at a deep position where an electric field is concentrated. Due to such a configuration, an impact ion current generated in the spot having a large electric field intensity hardly flows into a channel region disposed on a front surface. Accordingly, the generation of impact ions may be suppressed and the operation of the parasitic transistor is suppressed and hence, reliability of the semiconductor device and the resistance to ESD may be increased.

Figure 5:
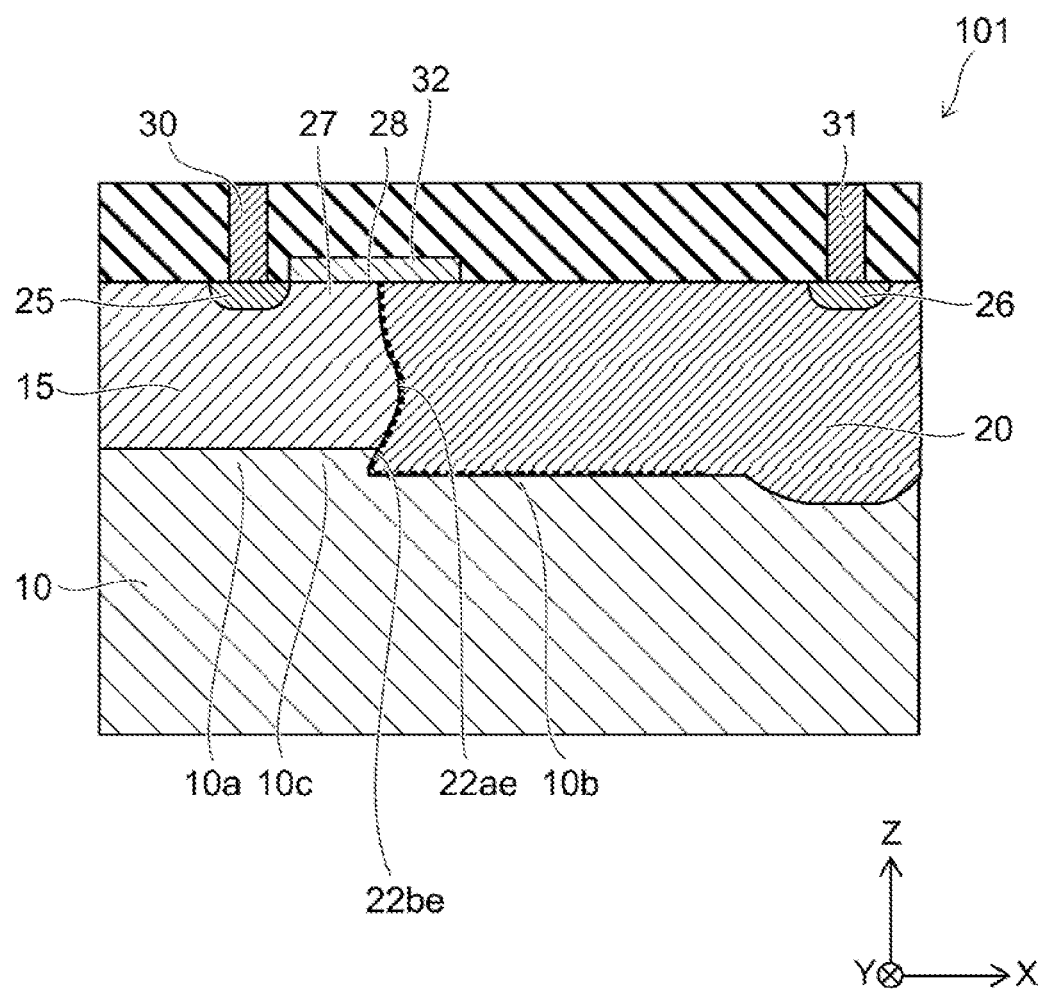
FIG. 5 is a schematic cross-sectional view illustrating a semiconductor device according to a modification of the example embodiment.

FIG. 5 is a schematic cross-sectional view which exemplifies a semiconductor device according to a modification of the embodiment.

As illustrated in FIG. 5, a semiconductor device 101 also includes: the semiconductor region 10; the first well region 15; the second well region 20; the source region 25; the drain region 26; the channel region 27; the gate insulation film 28; the source electrode 30; the drain electrode 31 and the gate electrode 32. The configurations explained with respect to the semiconductor device 100 are applicable to these components. The configuration of the semiconductor device 101 corresponds to the configuration which is obtained by omitting the insulating separation film 35 from the configuration of the semiconductor device 100.

Also in the semiconductor device 101, a concentration of an n-type dopant in the third region 10c is higher than a concentration of an n-type dopant in the first region 10a. Due to such dopant concentrations, the generation of impact ions is suppressed and the operation of the parasitic transistor may be suppressed and hence, reliability of the semiconductor device and the resistance to ESD may be increased.

Figure 6A:
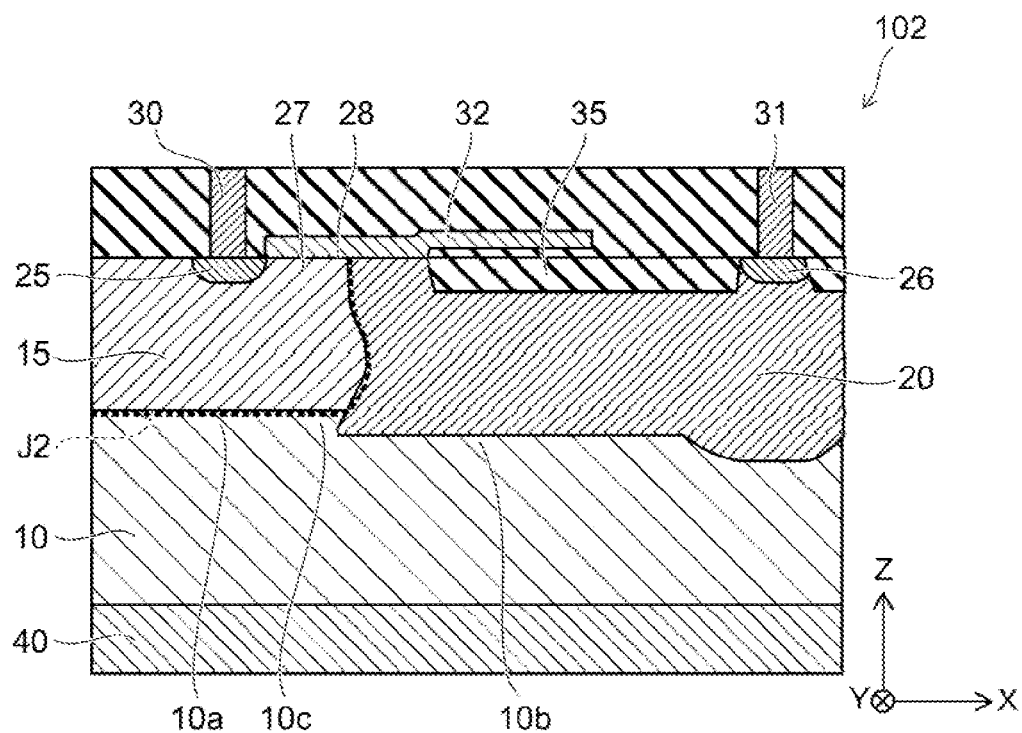
FIG. 6A and FIG. 6B are schematic cross-sectional views which exemplify semiconductor devices according to other modifications of the example embodiment.
Figure 6B:
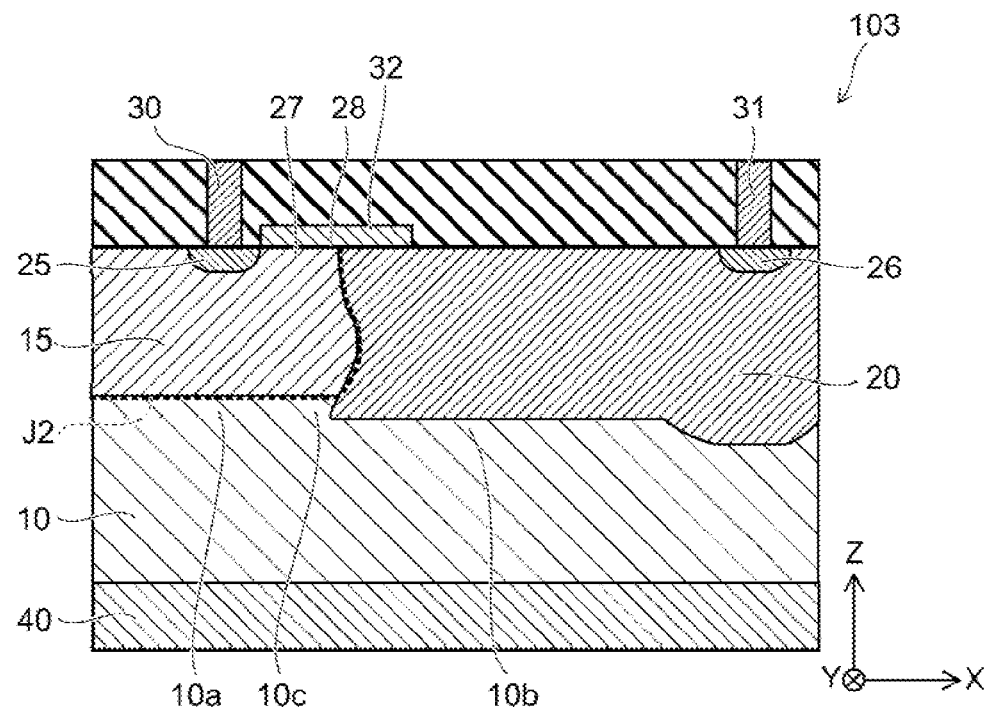

FIG. 6A and FIG. 6B are schematic cross-sectional views which exemplify semiconductor devices according to other modifications of the embodiment.

Also both a semiconductor device 102 illustrated in FIG. 6A and a semiconductor device 103 illustrated in FIG. 6B respectively include: the first well region 15; the second well region 20; the source region 25; the drain region 26; the channel region 27; the gate insulation film 28; the source electrode 30; the drain electrode 31; and the gate electrode 32. The configurations explained with respect to the semiconductor device 100 are applicable to these components.

The semiconductor device 102 and the semiconductor device 103 respectively include the semiconductor region 10. In this embodiment, the semiconductor region 10 is formed of an n-type epitaxial layer. The semiconductor region 10 (n-type epitaxial layer) is formed on a substrate 40.

The semiconductor device 102 further includes the insulating separation film 35. The insulating separation film 35 is disposed between the drain region 26 and the channel region 27.

The configuration of the semiconductor device 102 corresponds to the configuration which is obtained by replacing the semiconductor region 10 with an n-type epitaxial layer in the semiconductor device 100. The configuration of the semiconductor device 103 corresponds to the configuration which is obtained by omitting the insulating separation film 35 from the configuration of the semiconductor device 102.

In the semiconductor device 102 and the semiconductor device 103, a boundary J2 is a pn junction boundary.

Also in the semiconductor device 102 and the semiconductor device 103, a concentration of an n-type dopant in the third region 10c is higher than a concentration of an n-type dopant in the first region 10a. Due to such dopant concentrations, the generation of impact ions is suppressed and the operation of the parasitic transistor is suppressed and hence, reliability of the semiconductor device and the resistance to ESD may be increased.

Figure 7:
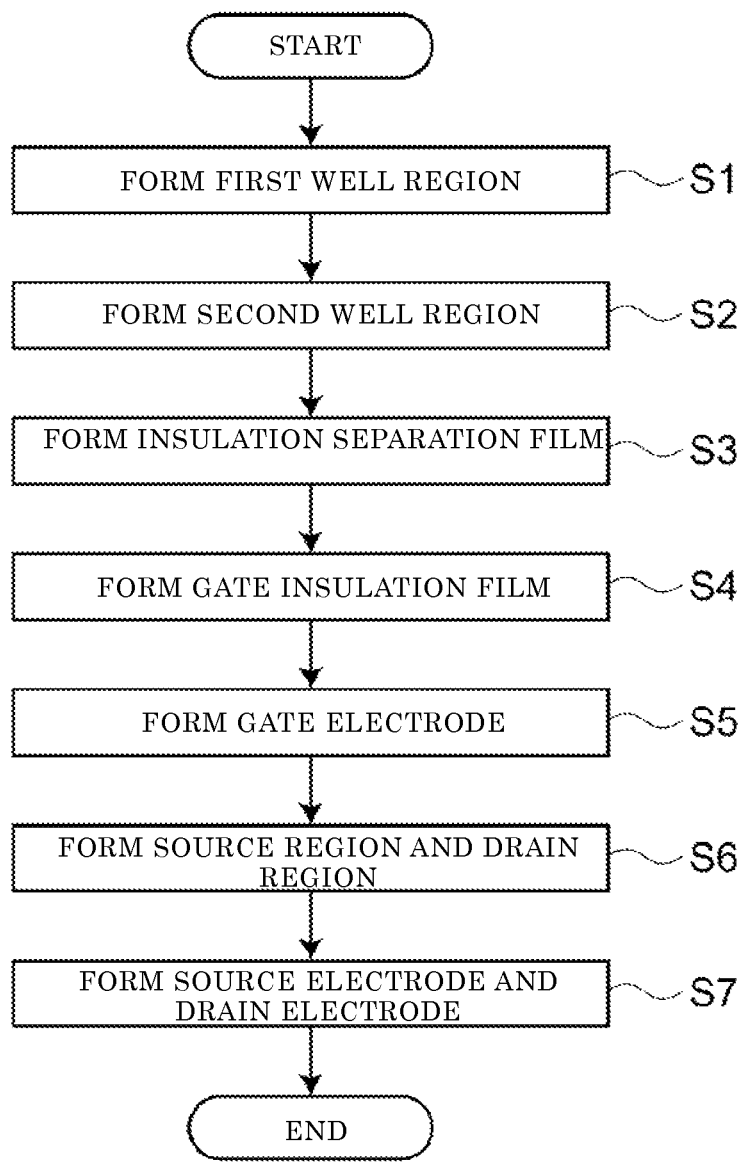
FIG. 7 is a flowchart illustrating a method of manufacturing the semiconductor device according to the example embodiment.

FIG. 7 is a flowchart which exemplifies a method of manufacturing the semiconductor device according to the embodiment.

In the method of manufacturing the semiconductor device 100 exemplified in FIG. 7, for example, the first well region 15 is formed (step S1), the second well region 20 is formed (step S2), the insulating separation film 35 is formed (step S3), the gate insulation film 28 is formed (step S4), the gate electrode 32 is formed (step S5), the source region 25 and the drain region 26 are formed (step S6), and the source electrode 30 and the drain electrode 31 are formed (step S7). The semiconductor device 100 is manufactured in accordance with such steps.

For example, the step S1 (first well forming step) includes a plurality of ion injections including performing a first ion injection. A p-type dopant is injected in the first well forming step. For example, the step S2 (second well forming) includes performing a plurality of ion injections including a second ion injection. An n-type dopant is injected in the second well forming step. The maximum values exemplified in FIG. 2 correspond to the plurality of ion injections respectively, for example.

A projected range Rp in a first ion injection is a first injection distance. The first injection distance is longer than respective projected ranges in the plurality of ion injections of the first well forming step. For example, the first ion injection corresponds to the first maximum value M1. The first injection distance corresponds to the first depth Dz1.

A projected range in the second ion injection is a second injection distance. For example, the second ion injection corresponds to the fifth maximum value M5. The second injection distance corresponds to the second depth Dz2. The first injection distance is shorter than the second injection distance.

The second well forming step includes performing a third ion injection, for example. A projected range in the third ion injection is a third injection distance. For example, the third ion injection corresponds to the sixth maximum value M6. The third injection distance corresponds to the third depth Dz3. The first injection distance is longer than the third injection distance.

Due to such ion injections, distribution of concentration of a dopant which is exemplified in FIG. 2 may be achieved. Accordingly, it is possible to provide a semiconductor device where the generation of impact ions and the increase of an amount of impact ions are suppressed so that the resistance to an SOA is increased.

According to the embodiment, it is possible to provide a semiconductor device where an SOA is increased.

In the disclosure, "perpendicular" and "parallel" mean not only "perpendicular" and "parallel" in a strict meaning of the term but also encompasses "perpendicular yet having a fluctuation which is caused in a manufacturing step or the like" and "parallel yet having a fluctuation which is caused in a manufacturing step or the like", for example. That is, it is sufficient that "perpendicular" is "substantially perpendicular" and "parallel" is "substantially parallel".

The embodiments of the present disclosure have been explained by reference to the specific examples heretofore. However, the embodiments of the present disclosure are not limited to these specific examples. For example, with respect to the specific configurations of the respective elements such as the semiconductor region, the first well region, the second well region, the source region, the drain region, the channel region, the gate electrode, the gate insulation film, the drain region, the source electrode, the first region, the second region and the third region, these configurations fall within the scope of the present disclosure provided that those who are skilled in the art may carry out the present disclosure in the same manner as these embodiments by suitably selecting the configurations from a known range and may acquire the substantially equal advantageous effects as these embodiments.

Further, the combination of two or more elements in each specific example within a technically possible range also falls within the scope of the present disclosure provided that the combination contains the gist of the present disclosure.

Further, all semiconductor devices and all methods of manufacturing a semiconductor device which those who are skilled in the art may carry out by suitably changing designs based on the semiconductor devices and the method of manufacturing a semiconductor device which are described above as the embodiments of the present disclosure also fall within the scope of the present disclosure so long as these semiconductor devices and methods of manufacturing a semiconductor device contain the gist of the present disclosure.

Still further, various variations and modifications are conceivable to those who are skilled in the art within a category of the technical concept of the present disclosure, and it is construed that these variations and modifications also fall within the scope of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first well region of a first conductive type in a semiconductor region and extending from an upper surface pane of the semiconductor region in a first direction orthogonal to the upper surface plane to a first distance;
    a second well region of a second conductive type in the semiconductor region and adjacent to the first well region in a second direction perpendicular to the first direction and extending from the upper surface plane of the semiconductor region in the first direction to a second distance;
    a source region of the second conductive type on the first well region;
    a drain region of the second conductive type on the second well region; and
    a gate electrode on a portion of the semiconductor region between the source and drain regions, wherein the semiconductor region has a first region at a first position below the first well region in the first direction, a second region at a second position below the second well region in the first direction, and a third region at a third position below the first well region in the first direction and between the first position and the second position in the second direction,
    a concentration of a dopant of the second conductive type in the third region is higher than a concentration of a dopant of the second conductive type in the first region;
    wherein a distribution profile of dopant of the first conductive type within the first well region along the first direction has a plurality of peaks including a first peak,
    a distance along the first direction between the first peak and the upper surface plane of the semiconductor region below the gate electrode is greater than distances along the first direction between all other peaks in the plurality of peaks and the upper surface plane,
    a distribution profile of dopant of the second conductive type in the second well region along the first direction has a second peak, and
    a distance along the first between the second peak and the upper surface plane of the semiconductor region below the gate electrode is greater than the distance along the first direction between the first peak and the upper surface plane of the semiconductor region.

2. The semiconductor device according to claim 1, wherein the first well region extends in the second direction toward the second well region to a first well region edge portion, and
    the third position is below the first well region edge portion in the first direction.

3. The semiconductor device according to claim 1, wherein the first region and the third region are in direct contact with the first well region.

4. The semiconductor device according to claim 1, wherein the first region is below the source region in the first direction, and
    the third region is below the gate electrode in the first direction.

5. The semiconductor device according to claim 1, wherein the first distance is less than the second distance.

6. The semiconductor device according to claim 5, wherein a difference between the second distance and the first distance is in a range from 0.1 micrometers to 0.5 micrometers, inclusive.

7. The semiconductor device according to claim 1, wherein a difference between the distance along the first direction between the second peak and the upper surface plane of the semiconductor region and the distance along the first direction between the first peak and the upper surface plane of the semiconductor region is in a range from 0.1 micrometers to 0.5 micrometers, inclusive.

8. The semiconductor device according to claim 1, wherein
    the distribution profile of dopant of the second conductive type within the second well region along the first direction has a third peak, and
    a distance along the first direction between the third peak and the upper surface plane of the semiconductor region is less than the distance along the first direction between the first peak and the upper surface plane of the semiconductor region.

9. The semiconductor device according to claim 1, further comprising:
    an insulating separation film which is disposed between the source region and the drain region, and is in contact with the drain region.

10. The semiconductor device according to claim 1, wherein
    the second well region includes a first portion and a second portion between the first portion and the first well region in the second direction, and
    a concentration of a dopant of the second conductive type in the second portion is lower than a concentration of a dopant of the second conductive type in the first portion.

11. The semiconductor device according to claim 1, wherein the semiconductor region is of the first conductive type.

12. The semiconductor device according to claim 1, wherein the semiconductor region is of the second conductive type.

13. The semiconductor device according to claim 1, wherein the first conductive type is a p-type, and the second conductive type is an n-type.

14. The semiconductor device according to claim 1, wherein the first conductive type is an n-type, and the second conductive type is a p-type.

15. A method of manufacturing a semiconductor device, comprising:
    forming a first well region of a first conductive type in a semiconductor region; the first well region extending from a upper surface plane of the semiconductor region in a first direction orthogonal to the upper surface plane to a first distance;
    forming a second well region of a second conductive type in the semiconductor region; the second well region being adjacent to the first well region in a second direction perpendicular to the first direction and extending from the upper surface plane of the semiconductor region in the first direction to a second distance;

forming a source region of the second conductive type on the first well region;

forming a drain region of the second conductive type on the second well region, and forming a gate electrode on a portion of the semiconductor region between the source and drain regions, wherein the semiconductor region has a first region at a first position below the first well region in the first direction, a second region at a second position below the second well region in the first direction, and a third region at a third position below the first well region in the first direction and between the first position and the second position in the second direction, a concentration of a dopant of the second conductive type in the third region is higher than a concentration of a dopant of the second conductive type in the first region;

wherein a distribution profile of dopant of the first conductive type within the first well region along the first direction has a plurality of peaks including a first peak, a distance along the first direction between the first peak and the upper surface plane of the semiconductor region below the gate electrode is greater than distances along the first direction between all other peaks in the plurality of peaks and the upper surface plane, a distribution profile of dopant of the second conductive type in the second well region along the first direction has a second peak, and a distance along the first between the second peak and the upper surface plane of the semiconductor region below the gate electrode is greater than the distance along the first direction between the first peak and the upper surface plane of the semiconductor region.

16. The method of claim 15, wherein forming the first well region includes performing a first ion injection; and forming the second well region includes performing a ion injection, wherein a projected range in the first ion injection is a first injection distance, and a projected range in the second ion injection is a second injection distance, and the first injection distance is shorter than the second injection distance.

17. The method of claim 16, wherein a difference between the first injection distance and the second injection distance is in a range from 0.1 micrometers to 0.5 micrometers, inclusive.

* * * * *